US007964431B2

(12) United States Patent
Petti et al.

(10) Patent No.: US 7,964,431 B2
(45) Date of Patent: Jun. 21, 2011

(54) METHOD TO MAKE ELECTRICAL CONTACT TO A BONDED FACE OF A PHOTOVOLTAIC CELL

(75) Inventors: Christopher J Petti, Mountain View, CA (US); Mohamed M Hilali, Sunnyvale, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 0 days.

(21) Appl. No.: 12/407,064

(22) Filed: Mar. 19, 2009

(65) Prior Publication Data

US 2010/0240169 A1 Sep. 23, 2010

(51) Int. Cl.
*H01L 21/00* (2006.01)
(52) U.S. Cl. ............. 438/68; 438/785; 438/73; 438/92; 438/64; 438/462; 257/E21.599; 257/E21.359; 257/E21.088
(58) Field of Classification Search .................. 438/68, 438/73, 785, 92, 64, 462; 257/E21.001, E21.599
See application file for complete search history.

(56) References Cited

U.S. PATENT DOCUMENTS

| 6,146,979 | A | 11/2000 | Henley et al. |
| 6,544,862 | B1 * | 4/2003 | Bryan ........................... 438/455 |
| 2007/0277874 | A1 | 12/2007 | Dawson-Elli et al. |
| 2008/0070340 | A1 | 3/2008 | Borrelli et al. |
| 2009/0197368 | A1 * | 8/2009 | Sivaram et al. ................ 438/73 |

OTHER PUBLICATIONS

Mitchell, Emily and Stefan Reber, "Emitter Wrap-Through Structure for Rear-Side Contacting of Epitaxial Thin-Film Solar Cells", 33rd IEEE Photovolatic Specialists Conference. Proceedings, 2008.
Knauss et al., "Emitter Wrap Through Solar Cells Using Electroless Plating Metallisation", 17th European Solar Energy Conference and Exhibition, 2001.
E. Van Kerschaver and G. Beaucanre, "Back-Contact Solar Cells: A Review", Progress in Photovoltaics: Research and Applications 14(2), 2006, pp. 107-123.
Clement et al., Processing and Comprehensive Characterisation of Screen-Printed MC-Si Metal Wrap through (MWT) Solar Cell, 22nd European Photovoltaic Solar Energy Conference and Exhibition, 2007.
U.S. Appl. No. 12/026,530, filed Feb. 5, 2008 entitled "Method to Form a Photovoltaic Cell Comprising a Thin Lamina".
U.S. Appl. No. 12/331,376, filed Dec. 9, 2008 entitled "Front Connected Photovoltaic Assembly and Associated Methods".
U.S. Appl. No. 12/403,187, filed Mar. 12, 2009 entitled "Back-Contact Photovoltaic Cell Comprising a Thin Lamina Having a Superstrate Receiver Element".

* cited by examiner

*Primary Examiner* — Matthew Smith
*Assistant Examiner* — Wilner Jean Baptiste
(74) *Attorney, Agent, or Firm* — The Mueller Law Office, P.C.

(57) ABSTRACT

A photovoltaic cell is formed by bonding a donor body to a receiver element and cleaving a thin lamina from the donor body. Electrical contact is made to the bonded surface of the lamina through vias formed in the lamina. In some embodiments the emitter exists only at the bonded surface or only at the cleaved surface face; the emitter does not wrap through the vias between the surfaces. Wiring contacting each of the two surfaces is formed only at the cleaved face, and one set of wiring contacts the bonded surface through conductive material formed in the vias, insulated from the via sidewalls.

23 Claims, 10 Drawing Sheets

Embodiment of 12/026530

Embodiment of 12/026530

Embodiment of 12/026530

Embodiment of 12/026530

METHOD TO MAKE ELECTRICAL CONTACT TO A BONDED FACE OF A PHOTOVOLTAIC CELL

BACKGROUND OF THE INVENTION

The invention relates to a method to make electrical contact to opposing surfaces of a photovoltaic cell.

Many photovoltaic cells have a first surface heavily doped to a first conductivity type and a second, opposing surface doped to a second conductivity type opposite the first, where current flows through both surfaces. Electrical contact thus must be made to both surfaces.

As will be described, using some fabrication methods it may be more difficult to make electrical contact to one of these surfaces. Novel methods to make electrical contact to opposing surfaces of a photovoltaic cell may be required.

SUMMARY OF THE PREFERRED EMBODIMENTS

The present invention is defined by the following claims, and nothing in this section should be taken as a limitation on those claims. In general, the invention is directed to a novel method to make electrical contact to the surface of a photovoltaic cell which is bonded to a receiver element.

A first aspect of the invention provides for a method for forming a photovoltaic assembly, the method comprising: bonding a first surface of a semiconductor donor body to a receiver element, with zero, one, or more layers intervening; cleaving a semiconductor lamina from the donor body at a cleave plane, wherein the first surface of the donor body is the first surface of the lamina and remains bonded to the receiver element, and wherein a second surface is created by cleaving, the second surface opposite the first; after the cleaving step, forming first conductive fingers and second conductive fingers, wherein the lamina is between the first fingers and the receiver element, and between the second fingers and the receiver element; and forming a photovoltaic cell, wherein the photovoltaic assembly comprises the lamina, the receiver element, and the photovoltaic cell, wherein, during normal operation of the cell, photocurrent flows between the first fingers and the second fingers, crossing both the first surface and the second surface.

Another aspect of the invention provides for a method for forming a photovoltaic assembly, the method comprising: bonding a first surface of a semiconductor donor body to a receiver element, with zero, one, or more layers intervening; cleaving a semiconductor lamina from the donor body at a cleave plane, wherein the first surface of the donor body is the first surface of the lamina and remains bonded to the receiver element, and wherein a second surface is created by cleaving, the second surface opposite the first; after the cleaving step, forming vias through the lamina; forming first conductive fingers, the lamina between the first conductive fingers and the receiver element, wherein the first conductive fingers are in electrical contact with the first surface by way of conductive material in the vias; and forming a photovoltaic cell, wherein the photovoltaic cell comprises the lamina.

Yet another aspect of the invention provides for a method for forming a photovoltaic assembly, the method comprising: bonding a first surface of a semiconductor donor body to a receiver element, with zero, one, or more layers intervening; cleaving a semiconductor lamina from the donor body at a cleave plane, wherein the first surface of the donor body is the first surface of the lamina and remains bonded to the receiver element, and wherein a second surface is created by cleaving, the second surface opposite the first; after the cleaving step, forming vias through the lamina, the vias having sidewalls; forming a conductive material in the vias, the conductive material electrically insulated from the via sidewalls; forming first conductive fingers, the lamina between the first conductive fingers and the receiver element; and fabricating a photovoltaic cell, wherein, during normal operation of the completed photovoltaic cell, photocurrent flows between the first fingers and the first surface by way of the conductive material in the vias.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
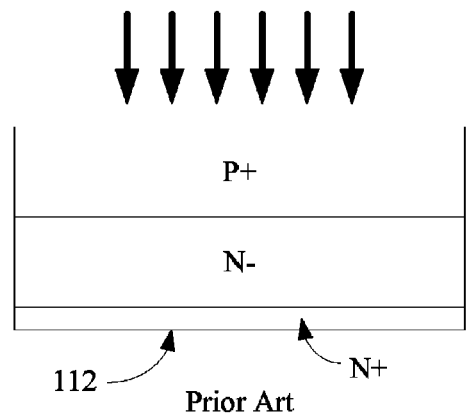
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either an n−/p+ junction (as shown in FIG. 1) or a p−/n+ junction. The more lightly doped region is known as the base of the photovoltaic cell, while the more heavily doped region is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
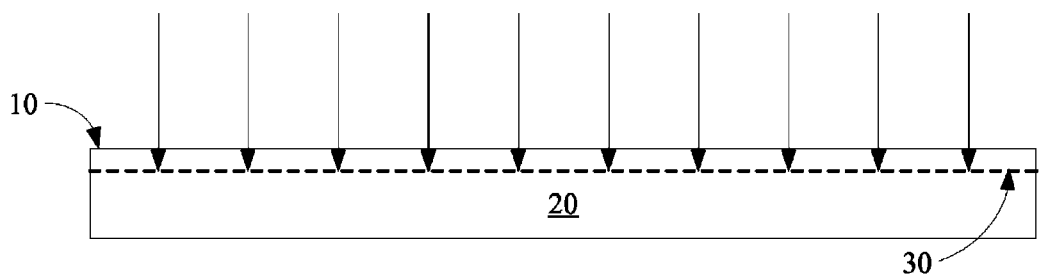
FIGS. 2a-2d are cross-sectional views showing stages in formation of an embodiment of Sivaram et al., U.S. patent application Ser. No. 12/026,530.
Figure 2B:
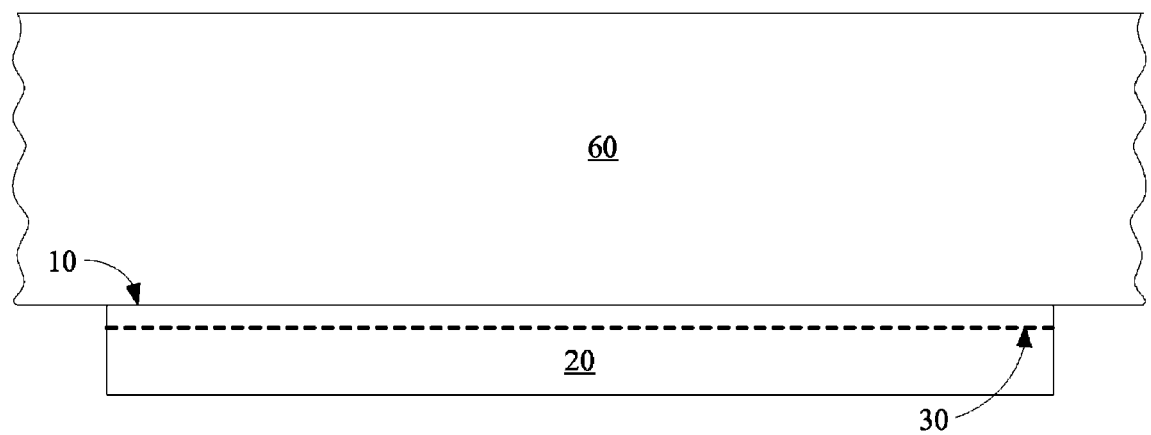
Figure 2C:
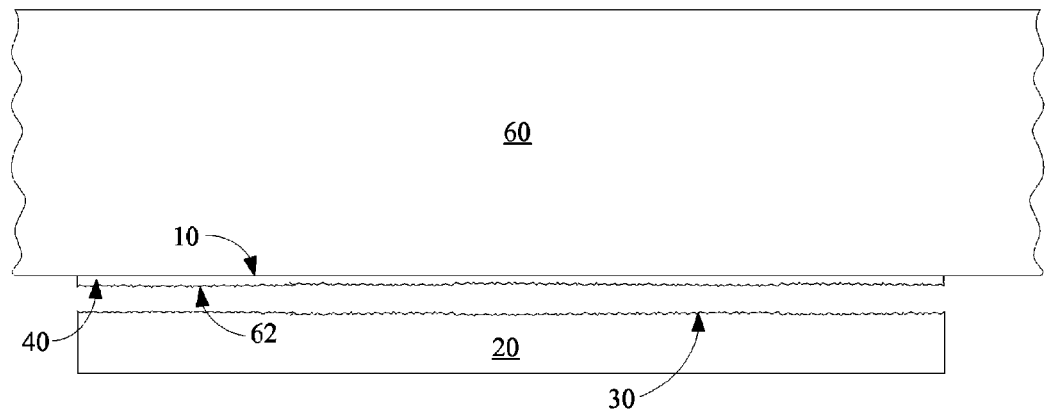
Figure 2D:
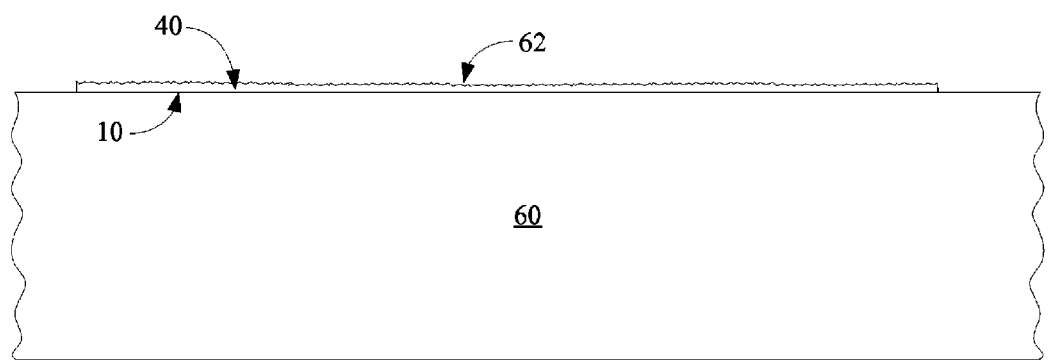

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference.

Using the methods of Sivaram et al., photovoltaic cells, rather than being formed from sliced wafers, are formed of thin semiconductor laminae without wasting silicon through excessive kerf loss or by fabrication of an unnecessarily thick cell, thus reducing cost. The same donor wafer can be reused to form multiple laminae, further reducing cost, and may be resold after exfoliation of multiple laminae for some other use.

In a cell with a heavily doped emitter region at one face and a heavily doped base region contact at the opposite face, with photocurrent flowing between them, electrical contact must be made to both faces. In a conventional cell, forming this electrical contact is straightforward. After the cell is fabricated, metal contacts are formed on both the front and back surfaces, and the cell is mounted to a supporting substrate or superstrate. For a photovoltaic cell fabricated using the methods of Sivaram et al., though, making electrical contact to both faces can be more difficult. Wiring formed between the donor wafer and the receiver element may interfere with bonding between them. One method to make contact to a bonded surface is disclosed in Petti et al., "Front Connected Photovoltaic Assembly," U.S. patent application Ser. No. 12/331,376, filed Dec. 9, 2008, owned by the assignee of the present application and hereby incorporated by reference. In Petti et al., contact is made only at the edges of the cell. It may be preferred to make contact to the bonded surface of the cell at more points, for example when contact is made by way of a higher resistance material, such as a transparent conductive oxide.

Figure 3A:
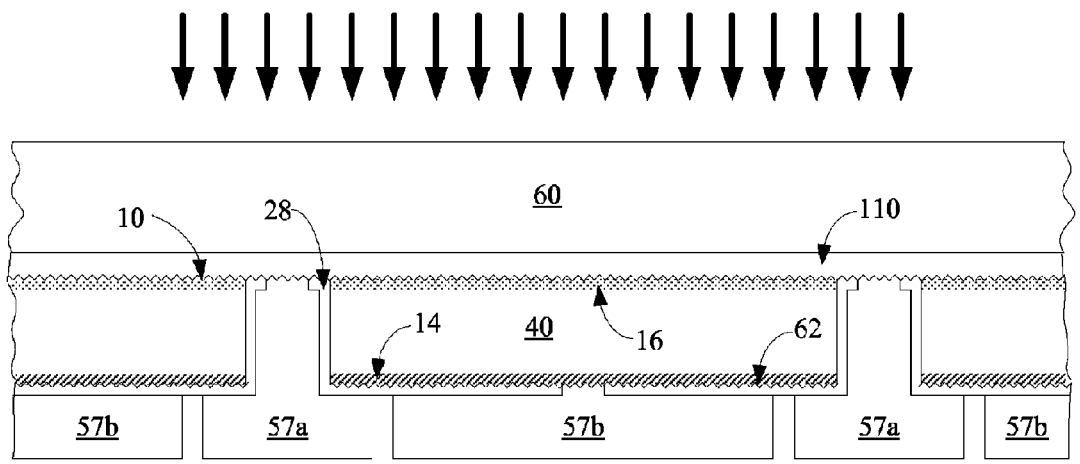
FIGS. 3a and 3b are cross-sectional views of embodiments of the present invention.

In the present invention, a photovoltaic cell is formed according to the methods of Sivaram et al. in which the cell requires electrical contact to opposing surfaces of the lamina. Referring to FIG. 3a, in an embodiment of the present invention, wiring set 57a electrically contacts first surface 10, where emitter 16 is formed, while wiring set 57b electrically contacts second surface 62, where heavily doped region 14 is formed, which contacts the base region. Both sets of wiring, 57a and 57b, are formed on the second surface 62 side of lamina 40, and no wiring intervenes between lamina 40 and receiver element 60, facilitating bonding. In this embodiment, layer 110 is a transparent conductive oxide, and receiver element 60 serves as a superstrate in the completed cell, as shown by arrows indicating incident light. Wiring set 57a makes electrical contact to doped first surface 10 by way of transparent conductive oxide (TCO) layer 110, and extend through vias 94 formed through lamina 40. In this embodiment, contact is made through holes in a dielectric layer 28, which lines the via sidewalls. Wiring sets 57a and 57b are formed of a conductive, reflective material, and serve to reflect light that has passed through lamina 40 back into the cell, improving efficiency.

Figure 3B:
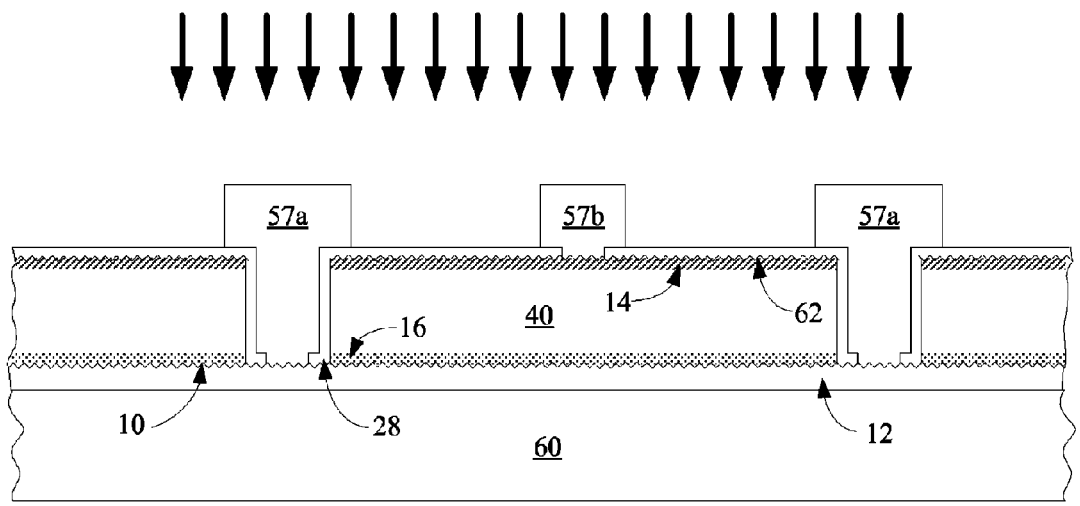

In another embodiment, as shown in FIG. 3b, receiver element 60 may serve as a substrate in the completed cell. In this case layer 12, between lamina 40 and receiver element 60, may be a reflective metal, metal compound, or metal alloy. Wiring set 57a, electrically contacting first surface 10, and wiring set 57b, electrically contacting second surface 62, are both formed at second surface 62, with lamina 40 between wiring 57a and 57b and receiver element 60. Layer 12 serves as a reflector in this cell. Heavily doped region 16 formed at one face of the cell, while heavily doped region 14, having the opposite conductivity type, is formed at the opposite face. Dielectric 28 isolates wiring 57a from the via sidewalls and from heavily doped region 14, and also serves as an antireflective coating (ARC).

Figure 3C:
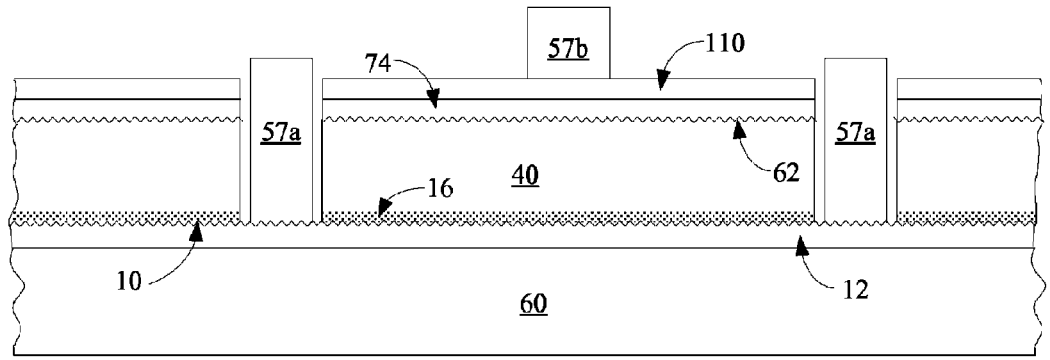

In another substrate embodiment, shown in FIG. 3c, a high-temperature doping step following exfoliation is avoided by replacing heavily doped region 14 with heavily doped amorphous silicon layer 74, formed on second surface 62. A TCO layer 110 may be formed on amorphous silicon layer 74. Amorphous silicon layer 74 is doped to a conductivity type opposite that of heavily doped region 16. Wiring 57a makes electrical contact to heavily doped region 16, in this case through conductive layer 12, at first surface 10, while wiring 57b makes electrical contact to heavily doped amorphous silicon layer 74 adjacent to second surface 62. Wiring 57a is smaller than the openings in which it is formed, and thus is electrically isolated from the sidewalls, though no dielectric layer is disposed between them.

Figure 4:
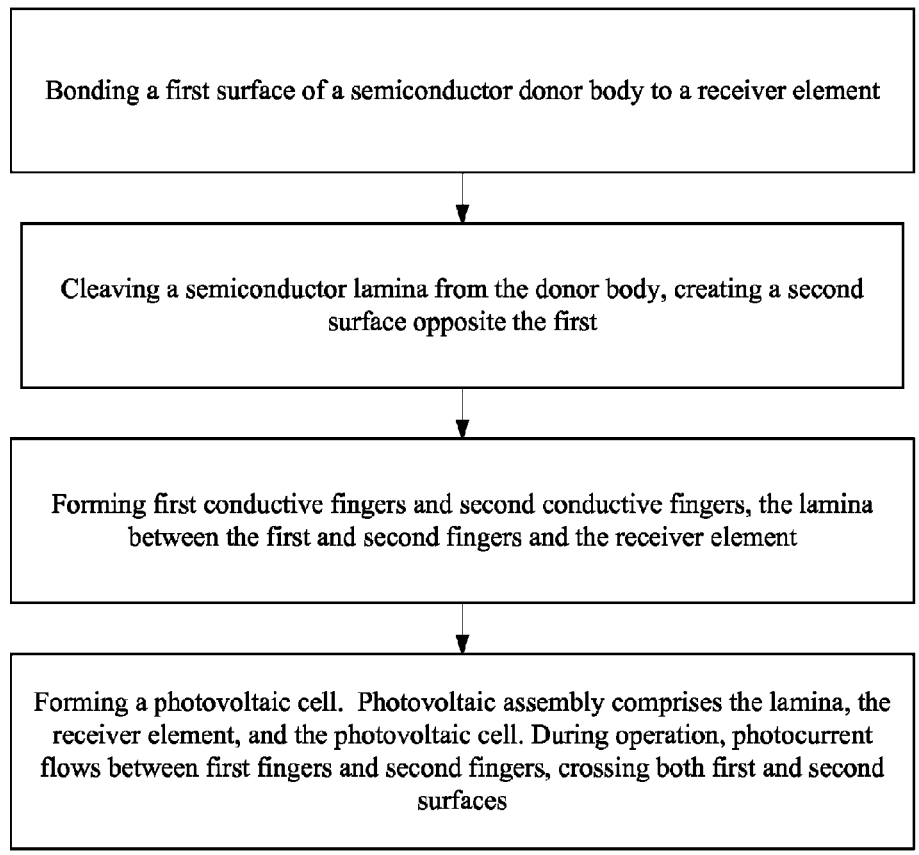
FIG. 4 is a flow diagram illustrating steps to form a photovoltaic assembly according to an embodiment of the present invention.

To summarize, in these embodiments, a photovoltaic assembly is formed by bonding a first surface of a semiconductor donor body to a receiver element, with zero, one, or more layers intervening; cleaving a semiconductor lamina from the donor body at a cleave plane, wherein the first surface of the donor body is the first surface of the lamina and remains bonded to the receiver element, and wherein a second surface is created by cleaving, the second surface opposite the first. After the cleaving step, the process continues by forming first conductive fingers and second conductive fingers, wherein the lamina is between the first fingers and the receiver element, and between the second fingers and the receiver element; and forming a photovoltaic cell, wherein the photovoltaic assembly comprises the lamina, the receiver element, and the photovoltaic cell. During normal operation of the cell, photocurrent flows between the first fingers and the second fingers, crossing both the first surface and the second surface. These steps are summarized in FIG. 4. For this example, during operation photocurrent flows from first conductive fingers 57a through the conductive material in vias 94, through TCO layer 110, through first surface 10, through emitter 16, through lamina 40, through base contact 14, through second surface 62, to second fingers 57b; in other embodiments current flow may be reversed.

The photovoltaic cell created includes a crystalline semiconductor lamina having a first surface and a second surface opposite the first, the thickness of the lamina between the first and second surfaces is about 50 microns or less, a first set of conductive fingers; and a second set of conductive fingers, wherein both the first set and the second set of conductive fingers are formed on the second surface side of the lamina, and wherein, during normal operation of the cell, photocurrent flows between the first fingers and the second fingers, crossing both the first surface and the second surface.

As mentioned earlier, in a conventional cell, it is usual to form wiring at both the front and back surface of a photovoltaic cell. The area occupied by the front surface wiring is generally kept to a minimum, as this wiring shades portions of the active area of the cell, decreasing cell efficiency. To address this loss of efficiency due to shading, conventional photovoltaic cells made from wafers, having thickness of, for example, 200, 250, 300 microns or more, have been fabricated having wiring formed only at the back surface. Contact to the front of the cell is made through holes in the wafer. The thickness of the wafer requires that the emitter, which is typically formed at the front surface, be formed by doping the sidewalls of these holes to the same conductivity type as the emitter. In this type of cell, the emitter is said to "wrap through" to the back surface. In an emitter wrap-through cell, the holes may be unfilled, and contact between the front and back of the cell is made solely through the doped sidewalls. In a metal wrap-through cell, the emitter wraps through from front to back, and a conductive material is formed in the holes, contacting the doped sidewalls.

In embodiments of the present invention, the very different methods of fabrication dictate distinct methods and structure. Because the lamina is much thinner than a conventional cell, in general no wrapthrough, either of an emitter or of a base contact, is required. In embodiments to be described, the via sidewalls need not be doped, simplifying fabrication and avoiding a high-temperature step. In fact, when using a very thin lamina it becomes practical to electrically isolate the sidewalls from the conductive material in the vias. With no wrapthrough, this isolation is generally required.

For clarity, a detailed example of a photovoltaic cell having heavily doped opposing faces, with wiring formed on only one side of the cell, and including a lamina having thickness between 0.2 and 100 microns according to embodiments of the present invention, will be provided. For completeness, many materials, conditions, and steps will be described. It will be understood, however, that many of these details can be modified, augmented, or omitted while the results fall within the scope of the invention. In these embodiments, it is described to cleave a semiconductor lamina by implanting gas ions and exfoliating the lamina. Other methods of cleaving a lamina from a semiconductor wafer could also be employed in these embodiments.

Example

The process begins with a donor body of an appropriate semiconductor material. An appropriate donor body may be a monocrystalline silicon wafer of any practical thickness, for example from about 200 to about 1000 microns thick. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductors materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with no unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 5A:
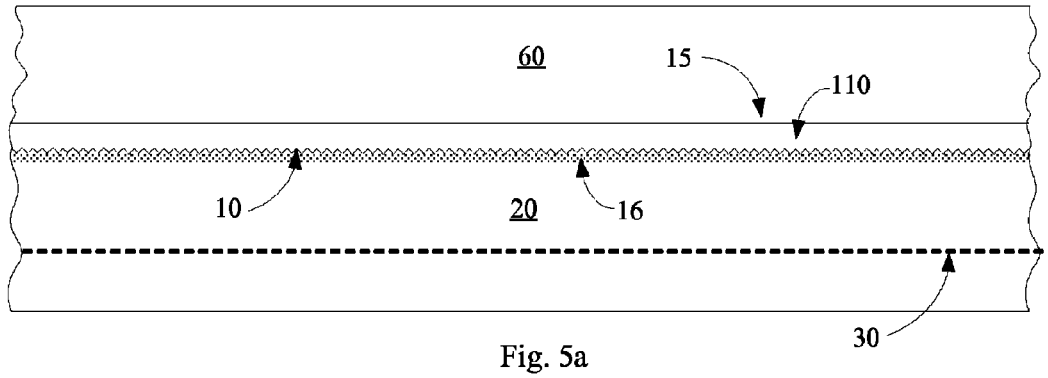
FIGS. 5a-5d are cross-sectional views showing stages of formation of an embodiment of the present invention.

Referring to FIG. 5a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. The fact that donor wafer 20 can be reused for some other purpose following exfoliation of one or more laminae makes the use of higher-quality silicon economical; thus donor wafer 20 may be semiconductor-grade silicon, rather than solar-grade silicon, for example.

First surface 10 of donor wafer 20 may be substantially planar, or may have some preexisting texture. If desired, some texturing or roughening of first surface 10 may be performed. Surface roughness may be random or may be periodic, as described in "Niggeman et al., "Trapping Light in Organic Plastic Solar Cells with Integrated Diffraction Gratings," Proceedings of the 17$^{th}$ European Photovoltaic Solar Energy Conference, Munich, Germany, 2001. Methods to create surface roughness are described in further detail in Petti, U.S. patent application Ser. No. 12/130,241, "Asymmetric Surface Texturing For Use in a Photovoltaic Cell and Method of Making," filed May 30, 2008; and in Herner, U.S. patent application Ser. No. 12/343,420, "Method to Texture a Lamina Surface Within a Photovoltaic Cell," filed Dec. 23, 2008, both owned by the assignee of the present application and both hereby incorporated by reference.

First surface 10 is heavily doped to the opposite conductivity type as wafer 20, forming heavily doped region 16; in this example, heavily doped region 16 is p-type. A p-n junction exists between lightly doped n-type wafer 20 and heavily doped p-type region 16; as will be seen, doped region 16 will serve as the emitter in the completed cell. As wafer 20 has not yet been affixed to a receiver element, high temperatures can be readily tolerated at this stage of fabrication, and this doping step can be performed by any conventional method, including diffusion doping, or deposition of doped glass followed by an anneal to drive in and activate the dopant. Any conventional p-type dopant may be used, such as boron. Dopant concentration may be as desired, for example at least $1 \times 10^{18}$ dopant atoms/cm$^3$, for example between about $1 \times 10^{18}$ and $1 \times 10^{21}$ dopant atoms/cm$^3$. Doping and texturing can be performed in any order, but since most texturing methods remove some thickness of silicon, it may be preferred to form heavily doped p-type region 16 following texturing. Doping is followed by conventional deglazing.

Next a transparent conductive oxide (TCO) 110 is deposited on first surface 10. Suitable TCOs include aluminum-doped zinc oxide, indium tin oxide, tin oxide, titanium oxide, etc. This layer may be between about 80 and about 300 nm thick, for example about 220 nm thick. The resistivity of TCO layer may range from about 0.2 milliOhm-cm to about 1 milliOhm-cm; sheet resistance of TCO 110 may be between about 10 and about 100 ohms/square, for example about 30 Ohm/square.

It has been found that a relatively thin layer of silicon dioxide, for example formed by plasma enhanced chemical vapor deposition (PECVD), may aid with an anodic bonding step to come. Silicon dioxide layer 15 is formed on TCO 110, and may be between about 300 and about 2000 angstroms thick, for example about 1000 angstroms thick. In some embodiments this layer may be omitted.

In the next step, ions, preferably hydrogen or a combination of hydrogen and helium, are implanted through silicon dioxide layer 15 and TCO layer 110 into wafer 20 to define a cleave plane 30, as described earlier. The cost of this hydrogen or helium implant may be kept low by methods described in Parrill et al., U.S. patent application Ser. No. 12/122,108, "Ion Implanter for Photovoltaic Cell Fabrication," filed May 16, 2008, owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 microns.

Next, wafer 20 is affixed to a receiver element 60, with silicon dioxide layer 15 and TCO 110 intervening. Receiver element 60 may be any suitable material. In this embodiment, receiver element will serve as a superstrate in the completed cell, and thus should be transparent. Suitable materials include glass, such as soda-lime glass or borosilicate glass. Borosilicate glass is particularly suitable for withstanding upcoming high-temperature steps. The wafer 20, receiver element 60, and intervening layers are bonded by any suitable method. If receiver element 60 is soda-lime glass, anodic bonding may be advantageous. In most embodiments, receiver element 60 has a widest dimension no more than about twenty percent greater than the widest dimension of wafer 20, and in most embodiments the widest dimension may be about the same as that of wafer 20.

Figure 5B:
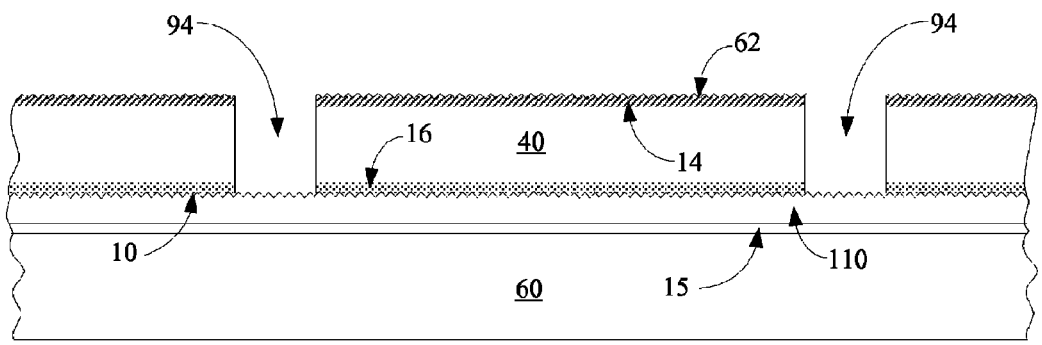

Referring to FIG. 5b, which shows the structure inverted with receiver element 60 on the bottom, a thermal step causes lamina 40 to cleave from donor wafer 20 at the cleave plane. In some embodiments, this cleaving step may be combined with a bonding step. Cleaving is achieved in this example by exfoliation, which may be performed at temperatures between, for example, about 350 and about 550 or 650 degrees C. In general exfoliation proceeds more rapidly at higher temperature. The thickness of lamina 40 is determined by the depth of cleave plane 30. In many embodiments, the thickness of lamina 40 is between about 1 and about 10 microns, for example between about 2 and about 5 microns. Bonding and exfoliation may be achieved using methods described in Agarwal et al., U.S. patent application Ser. No. 12/335,479, "Methods of Transferring a Lamina to a Receiver Element," filed Dec. 15, 2008, owned by the assignee of the present application and hereby incorporated by reference.

Second surface 62 has been created by exfoliation. Sufficient texturing may exist at second surface 62 upon exfoliation. If desired, an additional texturing step may be performed at second surface 62 by any of the methods described earlier. Such a texturing step may serve to remove damage at second surface 62. A specific damage-removal step may be performed, for example by a chemical etch or plasma treatment. Damage removal and texturing may be a combined step, or may be separate steps.

A doping step is performed to create heavily doped region 14 at second surface 62. In this embodiment heavily doped region 14 is doped to the same conductivity type as the body of lamina 40; thus heavily doped region 14 is doped n-type using any conventional dopant, for example phosphorus or arsenic. Heavily doped n-type region 14 will provide a contact to the base region of the completed cell.

Vias 94 are formed in lamina 40. In the present embodiment vias 94 are holes rather than trenches, and may be formed by any conventional method, for example by laser or some other suitable method. If vias 94 are formed by laser they may be about 120 microns across, for example in a grid pattern at a pitch of 2.4 mm in both X and Y. As will be appreciated by those skilled in the art, these dimensions are presented as examples only, and may be modified depending on many other factors, including the method used to form them, the resistivity of the base, the sheet resistance of TCO 110, the resistance of wiring to be formed, etc.

Figure 5C:
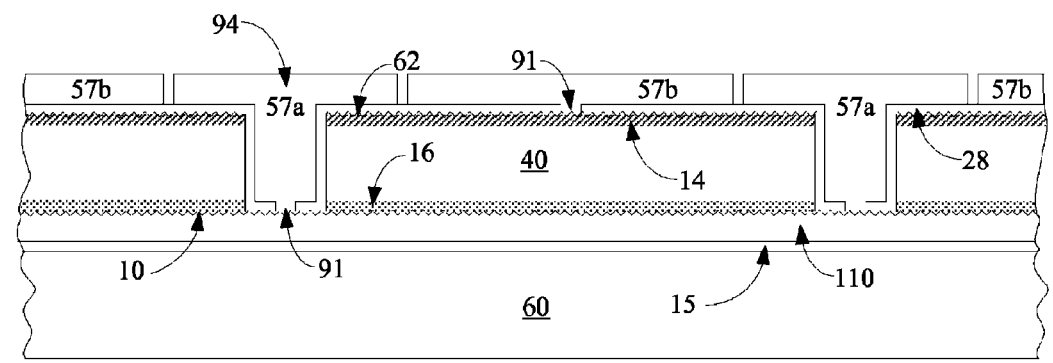

Turning to FIG. 5c, following formation of vias 94, a dielectric layer 28 is formed on second surface 62, filling vias 94. Dielectric layer 28 may be, for example, silicon nitride deposited by PECVD, and may be any suitable thickness, for example about 1000 angstroms thick. Holes 91 are formed both within and between vias 94. If these holes are formed by a laser they may be, for example, as small as about 15 microns across. The holes 91 within vias 94 cut through silicon nitride layer 28 to expose TCO 110. The holes 91 formed between vias 94 also cut through silicon nitride layer 28, and expose heavily doped n-type region 14. It may be most convenient for holes 91 to be formed at a pitch which is a divisor of the pitch of vias 94; for example the pitch of holes 91, in X and in Y, may be 1.2 mm. Clearly in other embodiments this pitch may be varied; for example there may be more than one hole 91 exposing heavily doped n-type layer 14 between each via 94.

Wiring 57 is formed next. Wiring 57 consists of two interleaved sets of wiring: set 57a, contacting TCO 110 through vias 94; and set 57b, contacting heavily doped n-type regions 14 through holes 91. These wiring sets are in the shape of interleaved fingers. Wiring may be formed by any suitable method, for example using silver screen-printed paste, which may be deposited and cured at a curing temperature of 600 degrees C. or less, though some other metal, metal alloy, or metal compound may be used instead. Polymer silver screen-printed paste can be cured at temperatures below 250 degrees C., for example below about 200 degrees C. Wiring 57 will serve as the back reflector in the completed cell, reflecting light back into lamina 40, so the area covered by wiring 57 is advantageously maximized; thus openings created between wiring set 57a and wiring set 57b to insulate them are generally kept narrow. In one embodiment, wiring set 57a lines are about 880 microns wide, while wiring set 57b lines are about 1280 microns wide, separated by gaps of about 120 microns. Wiring 57 may be formed by other methods and of other materials as well. In the embodiment described, wiring set 57a and wiring set 57b are formed in the same processing steps. Note that silicon nitride layer 28 electrically isolates the conductive material of wiring set 57a within vias 94 from the via sidewalls. Since wiring set 57a contacts emitter region 16, which is p-type, isolation from the sidewalls of vias 94, which are lightly doped n-type, and from n-type base contact 14, is advantageous. Dielectric layer 28 also allows wiring set 57a to be as wide as or wider than via 94, providing a reflective layer.

Figure 5D:
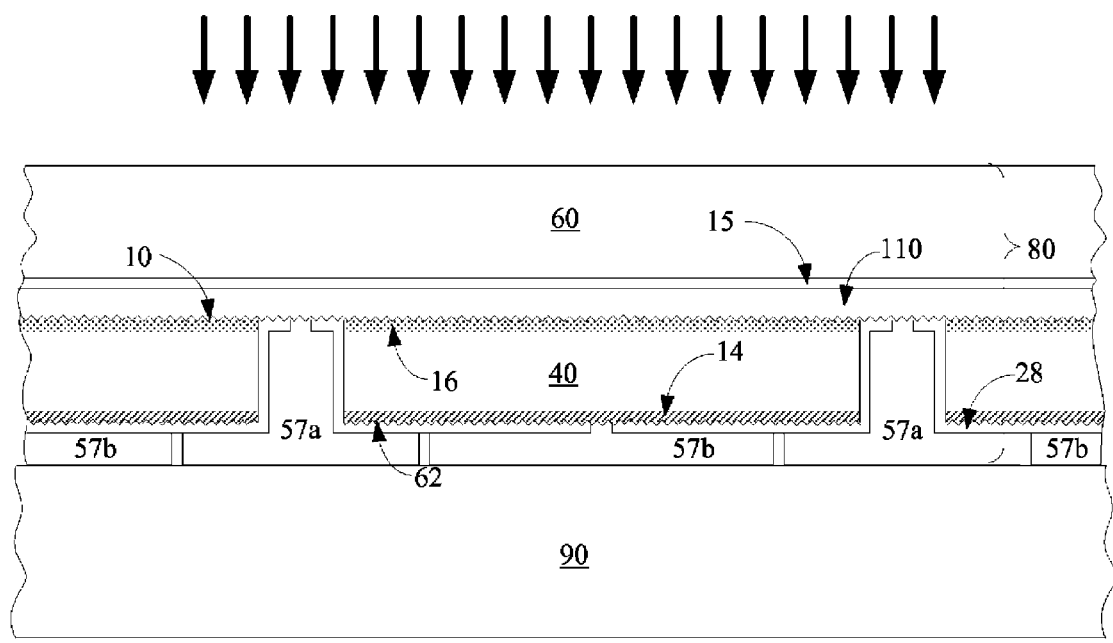

FIG. 5d shows completed photovoltaic assembly 80 which includes lamina 40 and receiver element 60, and includes a completed photovoltaic cell. FIG. 5d shows the structure with receiver element 60 at the top, serving as a superstrate, as during normal operation. Photovoltaic assembly 80, along with a plurality of other photovoltaic assemblies 80, can be mounted on supporting substrate 90, as shown, forming a photovoltaic module. Incident light, indicated by arrows, traverses receiver element 60, enters lamina 40 at first surface 10, and, after traveling through lamina 40, is reflected back into lamina 40 at second surface 62. Layer 28 may serve as a quarter wave plate, enhancing reflectivity of wiring 57. The photovoltaic cells of the photovoltaic assemblies 80 can be attached electrically in series.

In an alternative embodiment, TCO 110 may be omitted. In this case vias 94 are formed by etching, and an etch is chosen which can selectively stop on heavily doped p-type silicon. One such etch uses acetic acid, HF and $HNO_3$ at ratios of 40:1:2, performed at room temperature. Alternatively a timed etch may be used. In this case current will travel directly between the conductive material in vias 94 and heavily doped p-type region 16, the emitter.

Figure 6:
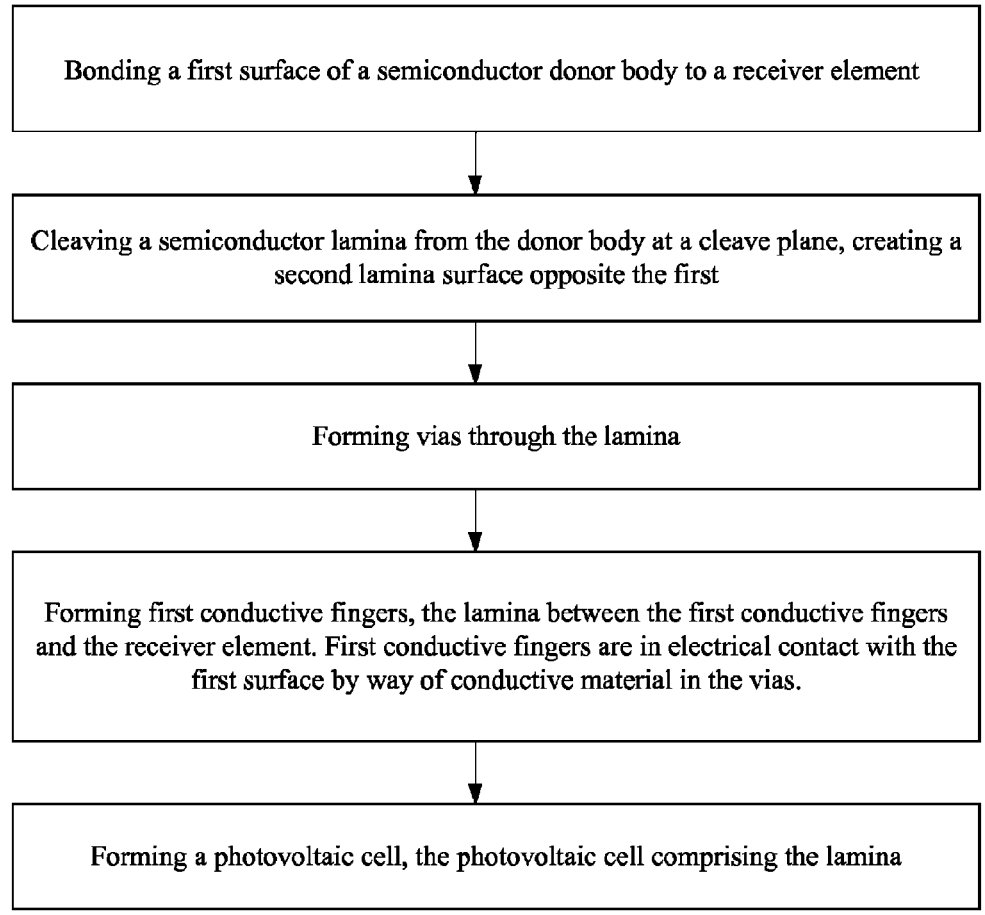
FIG. 6 is a flow diagram illustrating steps to form a photovoltaic assembly according to another embodiment of the present invention.

In this and other embodiments, a photovoltaic assembly is formed by bonding a first surface of a semiconductor donor body to a receiver element, with zero, one, or more layers intervening; cleaving a semiconductor lamina from the donor body at a cleave plane, wherein the first surface of the donor body is the first surface of the lamina and remains bonded to the receiver element, and wherein a second surface is created by cleaving, the second surface opposite the first. Following the cleaving step, vias are formed through the lamina. Next first conductive fingers are formed, the lamina between the first conductive fingers and the receiver element, wherein the first conductive fingers are in electrical contact with the first surface by way of conductive material in the vias. A photovoltaic cell is formed, wherein the photovoltaic cell comprises the lamina. This process is summarized in FIG. 6. Referring again to FIG. 5d, in this embodiment a conductive layer 110 intervenes between receiver element 60 and lamina 40, and the conductive material in vias 94 is in immediate contact with conductive layer 110.

Example

Low-Temperature Method

Another embodiment avoids any high-temperature steps following bonding and exfoliation. This may be advantageous for several reasons. Exposing the lamina to a high-temperature step while it is bonded to a receiver element entails the risk of damage to the receiver element; damage to the bond itself; unwanted dopant diffusion; and of potential contamination to the semiconductor lamina by adjacent material, for example by conductive material at the bonded first surface. Keeping post-bonding processing temperature low allows the use of a receiver element which is not formed of material that can tolerate high temperature; for example inexpensive soda-lime glass can replace borosilicate glass.

Figure 7A:
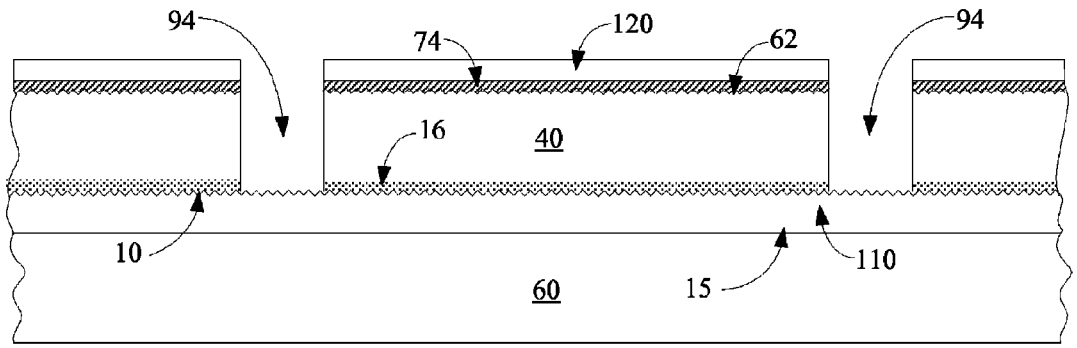
FIGS. 7a-7c are cross-sectional views showing stages of formation of another embodiment of the present invention.

As in the previous example, a first surface of a lightly doped n-type donor wafer is heavily doped, for example by diffusion doping, to form a heavily doped emitter region having the opposite conductivity type, in this case p-type. As in all embodiments, conductivity types can be reversed. A TCO layer is again deposited on the first surface, with an optional silicon dioxide layer to aid bonding. After the ion implantation step described earlier to define a cleave plane, the donor wafer is bonded to a receiver element. This receiver element will serve as the superstrate in the completed cell, and should be transparent. The lower processing temperatures of the present embodiment allow soda-lime glass, for example, to be used as the receiver element. Bonding is followed by exfoliation. FIG. 7a shows the structure following exfoliation, including receiver element 60, silicon dioxide layer 15, TCO 110, and lamina 40. Emitter region 16 was formed at first surface 10.

Note that it may be advantageous to avoid cooling the bonded donor wafer and receiver element between the bonding and exfoliation step. Due to a mismatch of thermal expansion between soda lime glass and the donor wafer, cooling more than about 50 degrees C. below the bonding temperature may cause damage to the wafer. Following exfoliation, however, the bonded lamina and receiver element may be cooled.

Second surface 62 has been created by exfoliation. Exfoliation may cause some damage at this surface. Recombination of charge carriers tends to occur at such damage sites, reducing cell efficiency, so it may be useful to remove or repair this damage. Texturing is optionally created at this surface by any of the methods described earlier. If texturing is not sufficient to remove damage at second surface 62, or if no texturing is performed, a damage-removal step is performed, for example a wet etch. A high-temperature step, such as a diffusion doping step, would tend to repair damage. As high temperature following exfoliation is avoided in this embodiment, this damage repair step may be particularly important. Texturing and damage repair may be combined, or may be separate steps.

A layer 74 of heavily doped n-type amorphous silicon is deposited on second surface 62. Layer 74 may be, for example, about 300 to about 700 angstroms thick, for example about 500 angstroms thick. Layer 74 is doped in situ, during deposition, using any conventional n-type dopant, such as phosphorus or arsenic.

Next a conductive layer 120 is formed on heavily doped n-type amorphous silicon layer 74. This layer 120 can be a TCO, and may be, for example, about 500 angstroms thick. After formation of layer 120, vias 94 are formed through TCO 120, heavily doped n-type amorphous layer 74, and lamina 40, exposing TCO 110. As in the previous embodiment, vias 94 may be holes, rather than trenches, and may be formed at the dimensions and pitch described earlier.

Figure 7B:
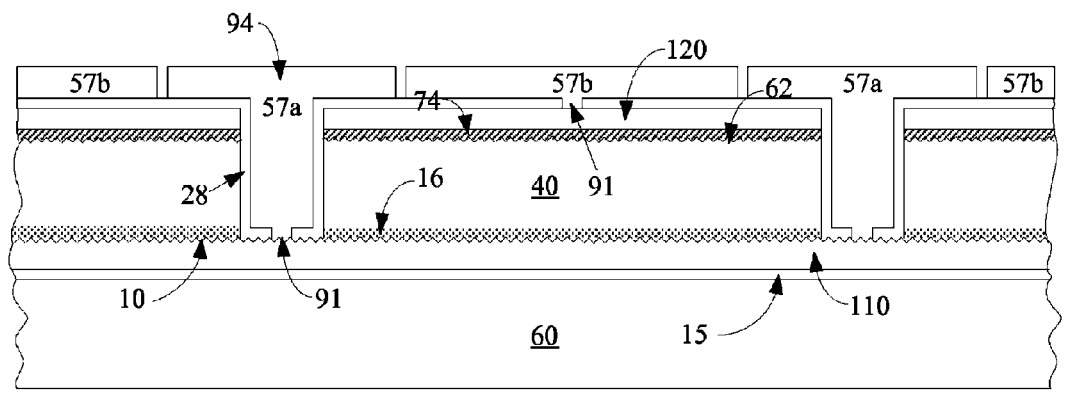

Turning to FIG. 7b, next a layer 28 of a dielectric material, for example, silicon nitride, is formed on TCO 120, filling vias 94. In a later step, a reflective layer will be formed at what will be the back of the completed cell. If about 1000 to 1500 angstroms of a transparent material, for example having index of refraction between about 1.8 and 2.2, intervenes between amorphous silicon layer 74 and the reflective layer to be formed, the transparent material will serve as a quarter wave plate, enhancing reflection. Thus the combined thickness of TCO 120 and silicon nitride layer 28, which is transparent, may be between about 1000 and about 1500 angstroms; for example, TCO 120 may be about 500 to about 700 angstroms thick, while silicon nitride layer 28 may be about 500 to 700 angstroms thick. Note that it may be preferred to maintain the deposition temperature of silicon nitride layer 28 at about 300 degrees C. or less.

As in the prior embodiment, holes 91 are opened in silicon nitride layer 28, for example using a laser, and wiring 57 is formed, with wiring set 57a contacting TCO 110 through holes 91 in vias 94 and wiring set 57b contacting TCO 120 through holes 91. As can be seen, TCO 110 contacts emitter region 16, while TCO 120 contacts heavily doped n-type amorphous silicon layer 74, which serves as the base contact. This embodiment offers the additional advantage that wiring sets 57a and 57b both contact a TCO layer; thus conditions for forming wiring 57, such as curing conditions, can be optimized to form both contacts simultaneously. The dimensions for wiring 57 may be the same as in the prior embodiment, or may be adjusted. For this embodiment, in general processing temperature following exfoliation of lamina 40 does not exceed about 500 degrees C.

Figure 7C:
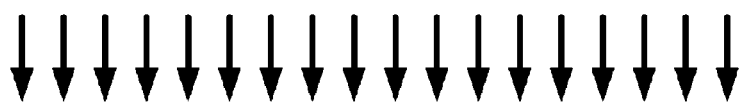
Figure 7C:
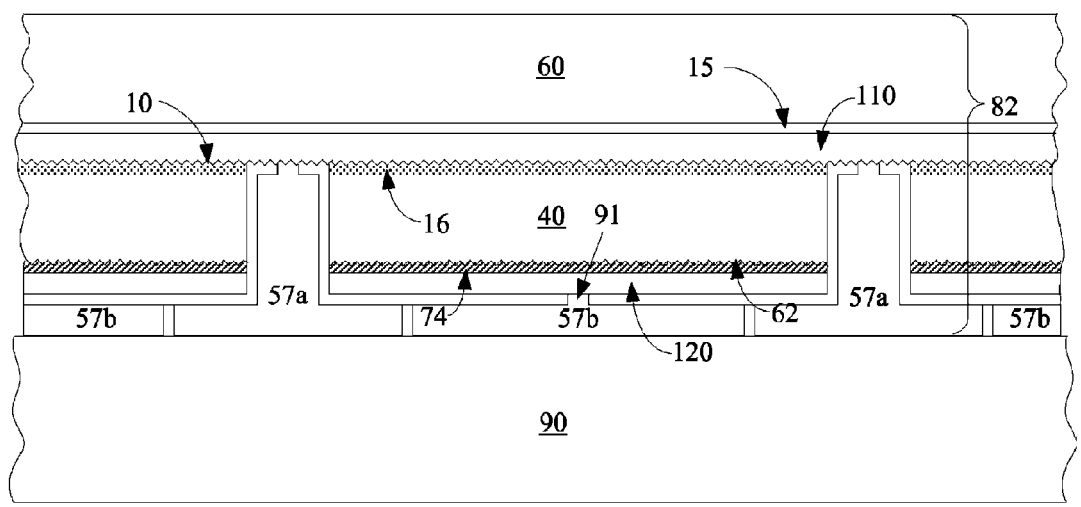

Turning to FIG. 7c, the structure is shown inverted, with receiver element 60 serving as a superstrate in the completed cell. Incident light, indicated by arrows, traverses receiver element 60, enters lamina 40 at first surface 10, and is reflected back into lamina 40 at second surface 62. Photovoltaic assembly 82 can be mounted on a supporting substrate 90, as shown, along with other photovoltaic assemblies 82, which may be connected in electrically in series, forming a photovoltaic module.

Many variations on this embodiment are possible. It may be preferred, for example, to form a reflective metal layer directly on heavily doped n-type amorphous silicon layer 74, for example.

Figure 8:
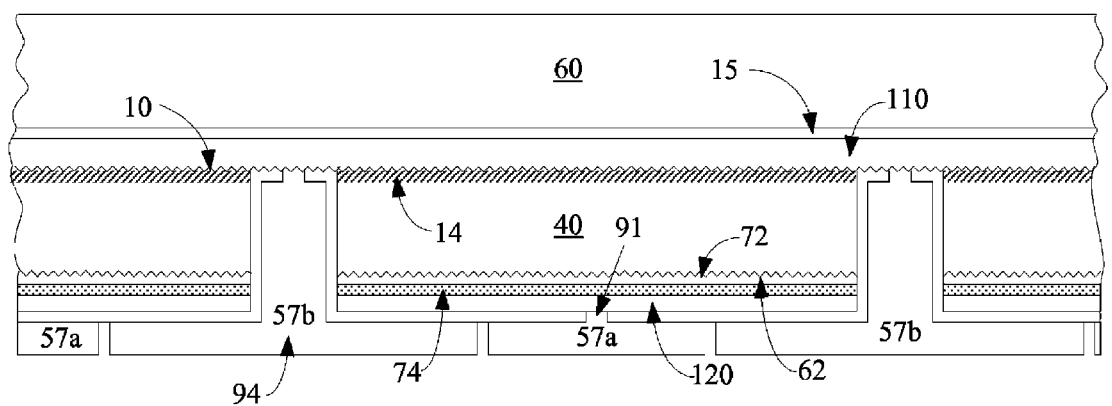
FIG. 8 is a cross-sectional view showing an additional embodiment of the present invention.

In the embodiments provided so far, the emitter region is formed at the first surface, which is bonded to the receiver element. In other embodiments, as shown in FIG. 8, the emitter may be formed at second surface 62. In this case, the body of lamina 40 may be lightly doped n-type. A doping step before bonding forms heavily doped region 14, which is also doped n-type, and will serve as a contact to the base region of the cell. A TCO layer 110 intervenes between lamina 40 and receiver element 60. Receiver element 60 may be glass, for example soda-lime glass, and optional silicon dioxide layer 15 may be included to aid bonding. A heavily doped p-type amorphous silicon layer 74 is formed at second surface 62, forming the emitter of the cell. Inclusion of a very thin intrinsic amorphous silicon layer 72 between second surface 62 and heavily doped p-type amorphous layer 74 may improve cell performance; this layer may be, for example, about 20 to about 50 angstroms thick. TCO 120 is formed on heavily doped p-type amorphous layer 74, and, after formation of vias 94, silicon nitride layer 28 is deposited on TCO 120 and within vias 94. Wiring 57b contacts TCO layer 110, which in turn contacts heavily doped n-type layer 14 at first surface 10, in this embodiment the contact to the base region, and wiring 57a contacts TCO layer 120, which contacts emitter 74. Receiver element 60 will serve as a superstrate, and the structure is shown with receiver element 60 at the top, as during operation. The photovoltaic assembly of FIG. 8 may be affixed to a supporting substrate or superstrate, as in prior embodiments. This embodiment is a low-temperature embodiment. A higher-temperature embodiment, more analogous to the first detailed example provided, which includes a high-temperature dopant diffusion step to create the emitter at the exfoliated surface, may be envisioned as well.

Figure 9:
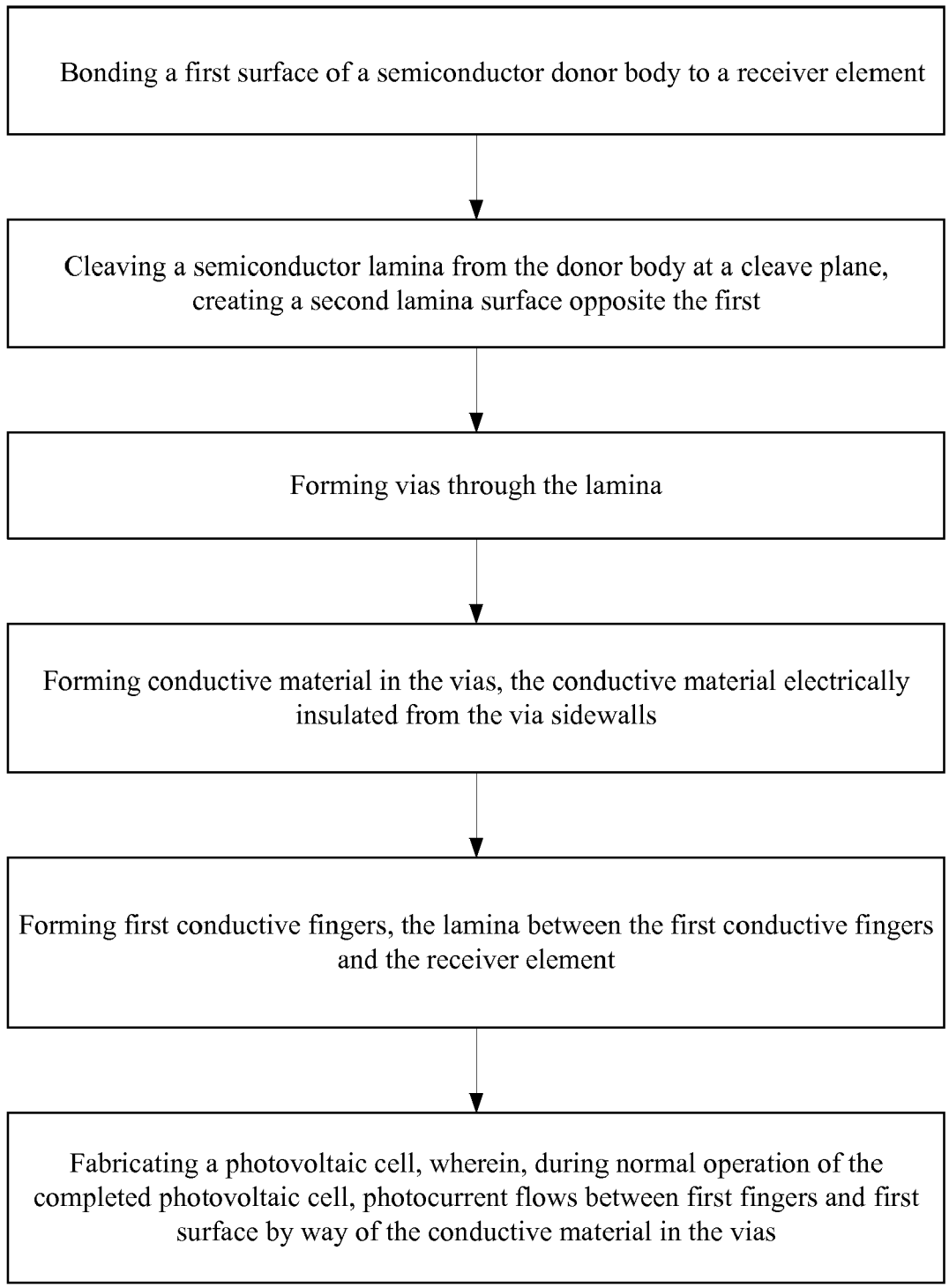
FIG. 9 is a flow diagram illustrating steps to form a photovoltaic assembly according to another embodiment of the present invention.

In the embodiments described, a photovoltaic assembly is formed by bonding a wafer to a receiver element and cleaving a lamina from the wafer, as has been described. After the cleaving step, vias having sidewalls are formed through the lamina, and conductive material is formed in the vias, where the conductive material is electrically insulated from the via sidewalls. First conductive fingers are formed, with the lamina between the first conductive fingers and the receiver element. A photovoltaic cell is fabricated, wherein, during normal operation of the completed photovoltaic cell, photocurrent flows between the first fingers and the bonded surface of the lamina by way of the conductive material in the vias. The via sidewalls are not subjected to any separate doping step, and thus are the same conductivity type as lamina 40, the base region of the cell. The base region is generally lightly doped to the conductivity type opposite that of the emitter. These steps are summarized in FIG. 9.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a photovoltaic assembly, the method comprising:
    bonding a first surface of a semiconductor donor body to a receiver element, with zero, one, or more layers intervening;
    cleaving a semiconductor lamina from the donor body at a cleave plane, wherein the first surface of the donor body is the first surface of the lamina and remains bonded to the receiver element, and wherein a second surface is created by cleaving, the second surface opposite the first;
    after the cleaving step, forming first conductive fingers and second conductive fingers, wherein the lamina is between the first fingers and the receiver element, and between the second fingers and the receiver element; and
    forming a photovoltaic cell, wherein the photovoltaic assembly comprises the lamina, the receiver element, and the photovoltaic cell,
    wherein, during normal operation of the cell, photocurrent flows from the first fingers to the second fingers or from the second fingers to the first fingers, crossing both the first surface and the second surface of the semiconductor lamina.

2. The method of claim 1 wherein, during normal operation of the cell, photocurrent flows from the first conductive fingers to the first surface, or from the first surface to the first conductive fingers, by way of vias passing through the lamina.

3. The method of claim 1 wherein a thickness of the lamina, between the first surface and the second surface, is between about 0.5 and about 20 microns.

4. The method of claim 1 wherein the first conductive fingers and the second conductive fingers are formed in the same processing steps.

5. The method of claim 1 further comprising, before the bonding step, forming the cleave plane by implanting gas ions through the first surface.

6. The method of claim 1 further comprising, before the bonding step, forming a first heavily doped region at the first surface, the heavily doped region having a first conductivity type.

7. The method of claim 6 wherein the first heavily doped region is the emitter of the cell.

8. The method of claim 6 further comprising forming a second heavily doped region at or adjacent to the second surface, the second conductivity type opposite the first.

9. The method of claim 8 wherein forming the second heavily doped region comprises depositing heavily doped amorphous silicon.

10. The method of claim 1 wherein, in the completed cell, the receiver element serves as a superstrate.

11. A method for forming a photovoltaic assembly, the method comprising:
  bonding a first surface of a semiconductor donor body to a receiver element, with zero, one, or more layers intervening;
  cleaving a semiconductor lamina from the donor body at a cleave plane, wherein the first surface of the donor body is the first surface of the lamina and remains bonded to the receiver element, and wherein a second surface is created by cleaving, the second surface opposite the first;
  after the cleaving step, forming vias through the lamina;
  forming first conductive fingers, the lamina between the first conductive fingers and the receiver element, wherein the first conductive fingers are in electrical contact with the first surface by way of conductive material in the vias; and
  forming a photovoltaic cell, wherein the photovoltaic cell comprises the lamina.

12. The method of claim 11 wherein a conductive layer intervenes between the receiver element and the lamina, and wherein the conductive material in the vias is in immediate contact with the conductive layer.

13. The method of claim 12 wherein the conductive layer is a transparent conductive oxide.

14. The method of claim 11 wherein the vias have sidewalls, and wherein the conductive material in the vias is electrically isolated from the sidewalls.

15. The method of claim 14 wherein the conductive material in the vias is metal, metal alloy, or metal compound.

16. The method of claim 11 wherein the semiconductor lamina is formed of monocrystalline or multicrystalline silicon.

17. The method of claim 11 wherein a maximum thickness of the lamina between the first surface and the second surface is between about 0.5 microns and about 20 microns.

18. A method for forming a photovoltaic assembly, the method comprising:
  bonding a first surface of a semiconductor donor body to a receiver element, with zero, one, or more layers intervening;
  cleaving a semiconductor lamina from the donor body at a cleave plane, wherein the first surface of the donor body is the first surface of the lamina and remains bonded to the receiver element, and wherein a second surface is created by cleaving, the second surface opposite the first;
  after the cleaving step, forming vias through the lamina, the vias having sidewalls;
  forming a conductive material in the vias, the conductive material electrically insulated from the via sidewalls;
  forming first conductive fingers, the lamina between the first conductive fingers and the receiver element; and
  fabricating a photovoltaic cell, wherein, during normal operation of the completed photovoltaic cell, photocurrent flows from the first fingers to the first surface, or from the first surface to the first fingers, by way of the conductive material in the vias.

19. The method of claim 18 further comprising, before the bonding step, forming a first heavily doped region having a first conductivity type at the first surface.

20. The method of claim 19 wherein the first heavily doped region serves as the emitter of the completed photovoltaic cell.

21. The method of claim 19 wherein the via sidewalls are lightly doped to a second conductivity type opposite the first, or are undoped.

22. The method of claim 18 wherein, following the cleaving step, processing temperature does not exceed about 500 degrees C.

23. The method of claim 18 wherein a maximum thickness of the lamina between the first surface and the second surface is between about 0.5 microns and about 20 microns.

* * * * *